(12) United States Patent
Yamashita et al.

(10) Patent No.: US 10,818,750 B2
(45) Date of Patent: Oct. 27, 2020

(54) SEMICONDUCTOR DEVICE AND METHOD FOR CONTROLLING SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Hiroaki Yamashita, Kanazawa (JP); Syotaro Ono, Kanazawa (JP); Hisao Ichijo, Kanazawa (JP); Takafumi Koumoto, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/541,231

(22) Filed: Aug. 15, 2019

(65) Prior Publication Data

US 2020/0303495 A1 Sep. 24, 2020

(30) Foreign Application Priority Data

Mar. 18, 2019 (JP) .................................. 2019-050063

(51) Int. Cl.
*H01L 29/06* (2006.01)
*H01L 23/552* (2006.01)

(52) U.S. Cl.
CPC ........ *H01L 29/0634* (2013.01); *H01L 23/552* (2013.01)

(58) Field of Classification Search
CPC .. H01L 29/0634; H01L 23/552; H01L 29/063
See application file for complete search history.

(56) References Cited

U.S. PATENT DOCUMENTS

| 2004/0016959 | A1* | 1/2004 | Yamaguchi | ......... H01L 29/0634 257/327 |
| 2006/0011962 | A1* | 1/2006 | Kocon | .................. H01L 29/407 257/302 |
| 2016/0118492 | A1 | 4/2016 | Asada et al. | |

FOREIGN PATENT DOCUMENTS

JP 5833277 B1 12/2015

* cited by examiner

*Primary Examiner* — Marc Anthony Armand
(74) *Attorney, Agent, or Firm* — Oblon, McClelland, Maier & Neustadt, L.L.P.

(57) ABSTRACT

A semiconductor device includes a semiconductor part including first to fifth layers; an electrode on a front surface of the semiconductor part; first and second control electrodes between the semiconductor part and the electrode. The first layer includes first and second portions alternately arranged along the front surface of the semiconductor part. The second layer is positioned between the first and second portions of the first layer. The first and second control electrodes are placed at boundaries of the first and second portions and the second layer, respectively. The third layer is provided between the second electrode and the first and second portions of the first layer. The fourth and fifth layers are selectively provided between the third layer and the second electrode. The first control electrode is opposed to the first, third and fourth layers. The second control electrode is opposed to the first, third and fifth layers.

11 Claims, 6 Drawing Sheets

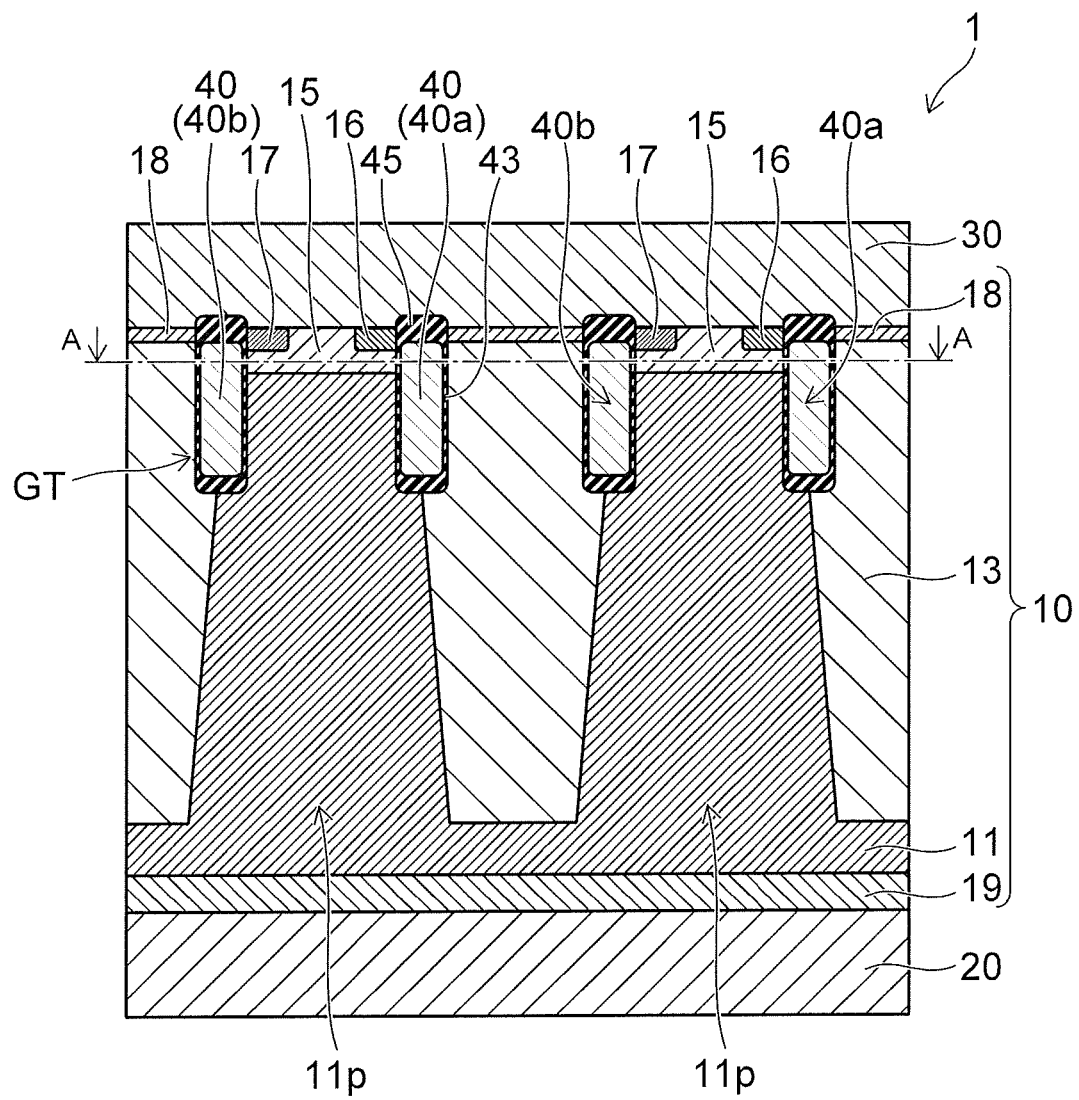
FIG. 1
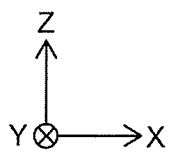

SEMICONDUCTOR DEVICE AND METHOD FOR CONTROLLING SAME

CROSS-REFERENCE TO RELATED APPLICATIONS

This application is based upon and claims the benefit of priority from Japanese Patent Application No. 2019-050063, filed on Mar. 18, 2019; the entire contents of which are incorporated herein by reference.

FIELD

Embodiments described herein relate generally to a semiconductor device and a method for controlling the same.

BACKGROUND

A power control semiconductor device may have a super junction structure (SJ-structure) in which n-type semiconductor layers and p-type semiconductor layers are alternately arranged in a direction crossing the current flow. It is possible in such a semiconductor device to achieve the lower ON resistance exceeding the limit due to the physical properties of semiconductor material such as silicon. In the semiconductor device having the SJ-structure, however, the electromagnetic interference (EMI) noise is large in the transition process, for example, from ON state to OFF state, because the pn junction in the SJ-structure has the broad area. Moreover, in the bridge circuit including two MOSFETs connected in series, either one of MOSFETs operates as the freewheeling diode, and the SJ-structure thereof may generate a large switching loss due to the delay of reverse recovery.

BRIEF DESCRIPTION OF THE DRAWINGS

FIG. 1 is a schematic cross sectional view showing a semiconductor device according to an embodiment;

DETAILED DESCRIPTION

Figure 2:
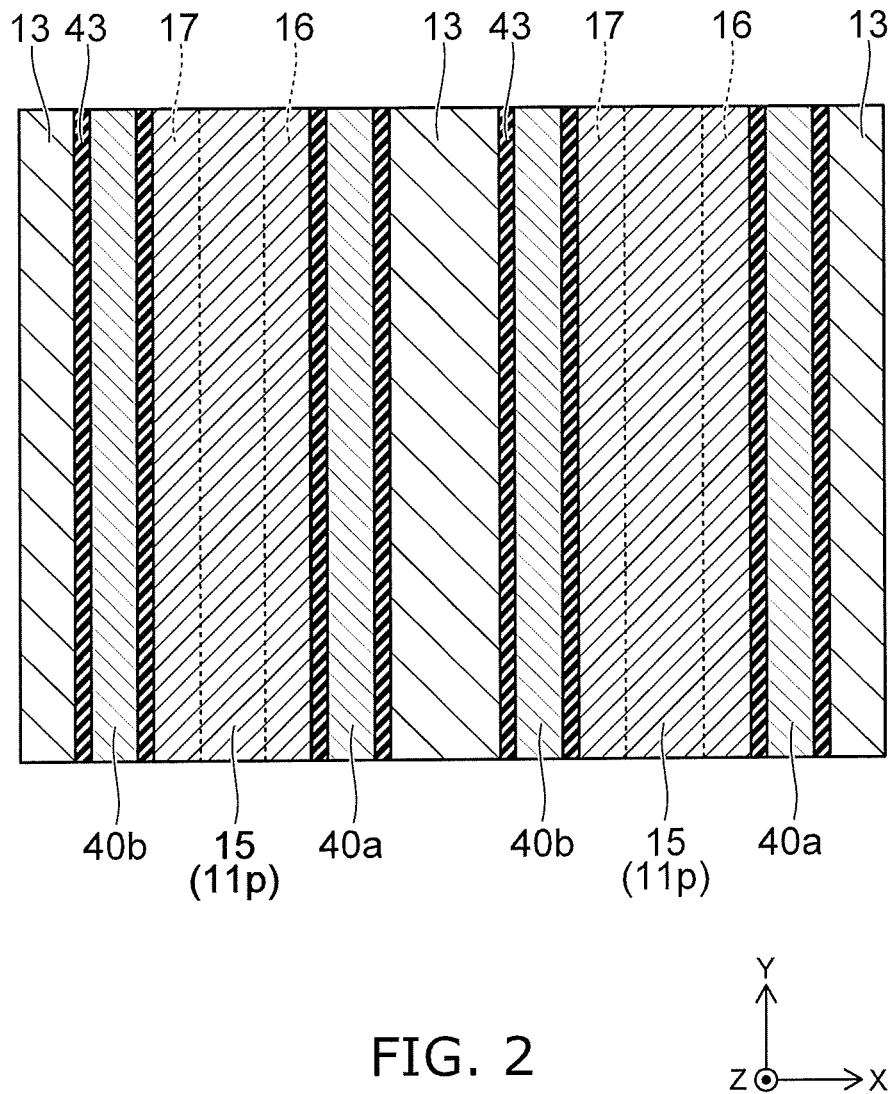
FIG. 2 is a plan view showing the semiconductor device according to the embodiment.

According to one embodiment, a semiconductor device includes a semiconductor part including a first semiconductor layer of a first conductivity type and a second semiconductor layer of a second conductivity type; a first electrode provided on a back surface of the semiconductor part; a second electrode provided on a front surface of the semiconductor part; and a plurality of control electrodes provided between the semiconductor part and the second electrode. The plurality of control electrodes include a first control electrode and a second control electrode adjacent to the first control electrode. The control electrodes each are placed inside a trench provided on the front surface side of the semiconductor part. The first control electrode is electrically insulated from the semiconductor part via a first insulating film. The second control electrode is electrically insulated from the semiconductor part via a second insulating film. The second semiconductor layer is provided in a plurality. The plurality of second semiconductor layers extend in the first semiconductor layer along a direction from the second electrode toward the first electrode. The first semiconductor layer includes first and second portions alternately arranged along the front surface of the semiconductor part. The second semiconductor layers each are positioned between the first and second portions of the first semiconductor layer. The first control electrode is placed at a boundary of the first portion of the first semiconductor layer and the second semiconductor layer. The second control electrode is placed at a boundary of the second portion of the first semiconductor layer and the second semiconductor layer. The semiconductor part further includes a third semiconductor layer of a second conductivity type, a fourth semiconductor layer of a first conductivity type and a fifth semiconductor layer of a second conductivity type. The third semiconductor layer is provided between the second electrode and the first and second portions of the first semiconductor layer. The third semiconductor layer is positioned between the first and second control electrode. The fourth semiconductor layer is selectively provided between the third semiconductor layer and the second electrode. The fifth semiconductor layer is selectively provided between the third semiconductor layer and the second electrode. The first control electrode is opposed to the first semiconductor layer, the third semiconductor layer, and the fourth semiconductor layer via the first insulating film. The second control electrode is opposed to the first semiconductor layer, the third semiconductor layer, and the fifth semiconductor layer via the second insulating film. The plurality of control electrodes are electrically insulated from the second electrode via a third insulating film. The second electrode is electrically connected to the fourth semiconductor layer and the fifth semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross sectional view showing a semiconductor device 1 according to an embodiment. The semiconductor device 1 is, for example, MOSFET, which has an SJ structure.

As shown in FIG. 1, the semiconductor device 1 includes a semiconductor part 10, a drain electrode 20 (a first electrode), a source electrode 30 (a second electrode), and a gate electrode 40 (a control electrode). The drain electrode 20 is provided on a back side of the semiconductor part 1.

The source electrode 30 is provided on a front surface of the semiconductor part 10. The semiconductor part 10 is, for example, silicon.

The gate electrode 40 is provided in a plurality, and the plurality of gate electrodes 40 are placed between the semiconductor part 10 and the source electrode 30. The gate electrode 40 is placed inside a gate trench GT. The gate trench is provided on the front surface side of the semiconductor part 10. The gate electrode 40 is electrically insulated from the semiconductor part 10 via a gate insulating film 43. The gate electrode 40 is electrically insulated from the source electrode 30 via an interlayer insulating film 45.

The gate electrode 40 is placed at a position opposite to an n-type semiconductor layer 11 and a p-type semiconductor layer 13 via the gate insulating film 43. That is, the gate electrode 40 is provided to be positioned at a boundary of the n-type semiconductor layer 11 and the p-type semiconductor layer 13.

The semiconductor part 10 includes the n-type semiconductor layer 11 (a first semiconductor layer) and the p-type semiconductor layer 13 (a second semiconductor layer). The p-type semiconductor layer 13 is provided in a plurality, and the plurality of p-type semiconductor layer 13 are placed in the n-type semiconductor layer 11. The p-type semiconductor layer 13 extends in a first direction (−Z-direction) from the source electrode 30 toward the drain electrode 20 in the n-type semiconductor layer 11. The plurality of p-type semiconductor layers 13 are arranged in a second direction (for example, X-direction) along the front surface of the semiconductor part 10.

As shown in FIG. 1, the p-type semiconductor layer 13 and the portion 11p of the n-type semiconductor layer 11 are, for example, arranged alternately in the X-direction. The p-type semiconductor layer 13 and the portion 11p of the n-type semiconductor layer 11 are, for example, provided to include the total amount of the p-type impurities substantially same as the total amount of the n-type impurities. For example, the p-type semiconductor layer 13 includes the portion positioned at the same level as the portion 11p of the n-type semiconductor layer 11, and the total amount of the p-type impurities in the portion of the p-type semiconductor layer 13 is substantially same as the total amount of the n-type impurities included in the portion 11p of the n-type semiconductor layer 11.

The semiconductor part 10 further includes a p-type diffusion layer 15 (a third semiconductor layer), an n-type source layer 16 (a fourth semiconductor layer), a p-type high concentration layer 17 (a fifth semiconductor layer), an n-type block layer 18 (a sixth semiconductor layer), and an n-type drain layer 19.

The plurality of gate electrodes 40 include a first gate electrode 40a and a second gate electrode 40b. The first gate electrode 40a is provided at a position opposite to the n-type semiconductor layer 11, the p-type diffusion layer 15 and the n-type source layer 16 via the gate insulating film 43. The second gate electrode 40b is placed at a position opposite to the n-type semiconductor layer 11, the p-type diffusion layer 15 and the p-type high concentration layer 17 via the other gate insulating film 43.

The p-type diffusion layer 15 is provided between the first and second gate electrodes 40a and 40b, which are adjacent in the X-direction. The p-type diffusion layer 15 is provided, for example, between the portion 11p of the n-type semiconductor layer 11 and the source electrode 30. The p-type diffusion layer 15 includes p-type impurities with a higher concentration than the concentration of p-type impurities in the p-type semiconductor layer 13. The first gate electrode 40a and the second gate electrode 40b are placed at the position with the p-type diffusion layer 15 interposed and opposite to each other.

The n-type source layer 16 is selectively provided between the p-type diffusion layer 15 and the source electrode 30. The n-type source layer 16, for example, is placed so that at least the portion thereof is opposed to the first gate electrode 40a via the gate insulating film 43. The n-type source layer 16 is placed so as to contact the gate insulating film 43. The n-type source layer 16 includes n-type impurities with a higher concentration than the concentration of n-type impurities in the n-type semiconductor layer 11.

The p-type high concentration layer 17 is selectively provided between the p-type diffusion layer 15 and the source electrode 30. The p-type high concentration layer 17, for example, is placed so that at least the portion thereof is opposed to the second gate electrode 40b via the gate insulating film 43. The p-type high concentration layer 17 is placed so as to contact the gate insulating film 43. The p-type concentration layer 17 includes p-type impurities with a higher concentration than the concentration of p-type impurities in the p-type diffusion layer 15.

The n-type block layer 18 is provided between the p-type semiconductor layer 13 and the source electrode 30. The n-type block layer 18 includes n-type impurities with a higher concentration than the concentration of n-type impurities in the n-type semiconductor layer 11. The n-type block layer 18 includes the n-type impurities with a lower concentration than the concentration of n-type impurities in the n-type source layer 16. The n-type block layer 18, for example, is provided to entirely cover the top surface of the p-type semiconductor layer 13.

The source electrode 30 is electrically connected to the p-type diffusion layer 15, the n-type source layer 16, the p-type high concentration layer 17, and the n-type block layer 18. For example, when the n-type inversion layer is induced between the p-type diffusion layer 15 and the first gate electrode 40a, the source electrode 30 is electrically connected to the n-type semiconductor layer 11 via the n-type source layer 16. That is, the n-type inversion layer is formed at an interface of the p-type diffusion layer 15 and the gate insulating film 43, and the electrical conduction is provided between the n-type source layer 16 and the n-type semiconductor layer 11 (and so on). When the p-type inversion layer is induced between the n-type semiconductor layer 11 and the second gate electrode 40b, the source electrode 30 is electrically connected to the p-type semiconductor layer 13 via the p-type high concentration layer 17 and the p-type diffusion layer 15. That is, the p-type inversion layer is formed at the interface of the n-type semiconductor layer 11 and the gate insulating film 43, and the electrical conduction is provided between the p-type diffusion layer 15 and the p-type semiconductor layer 13 (and so on). The n-type block layer 18 is provided to prevent holes from being transferred between the p-type semiconductor layer 13 and the source electrode 30.

FIG. 2 is a schematic plan view showing the semiconductor device 1 according to the embodiment. FIG. 2 is a cross sectional view along A-A line shown in FIG. 1, and shows an arrangement of the p-type semiconductor layer 13, the p-type diffusion layer 15, the portion 11p of the n-type semiconductor layer 11, the first gate electrode 40a, and the second gate electrode 40b. Further, the n-type source layer 16 and the p-type high concentration layer 17 are also shown in FIG. 2 by dot lines.

As shown in FIG. 2, the p-type semiconductor layer 13 and the portion 1lp of the n-type semiconductor layer 11 extend in the Y-direction, for example. The first gate electrode 40a and the second gate electrode 40b extend in the Y-direction, respectively, at the boundary of the p-type semiconductor layer 13 and the portion 11p of the n-type semiconductor layer 11.

The p-type diffusion layer 15 is provided to extend in the Y-direction between the first gate electrode 40a and the second gate electrode 40b. The p-type diffusion layer 15 is provided on the portion 11p of the n-type semiconductor layer 11.

The n-type source layer 16 extends in the Y-direction on the p-type diffusion layer 15 and along the first gate electrode 40a. The p-type high concentration layer 17 extends in the Y-direction on the p-type diffusion layer 15 and along the second gate electrode 40b.

Figure 3:
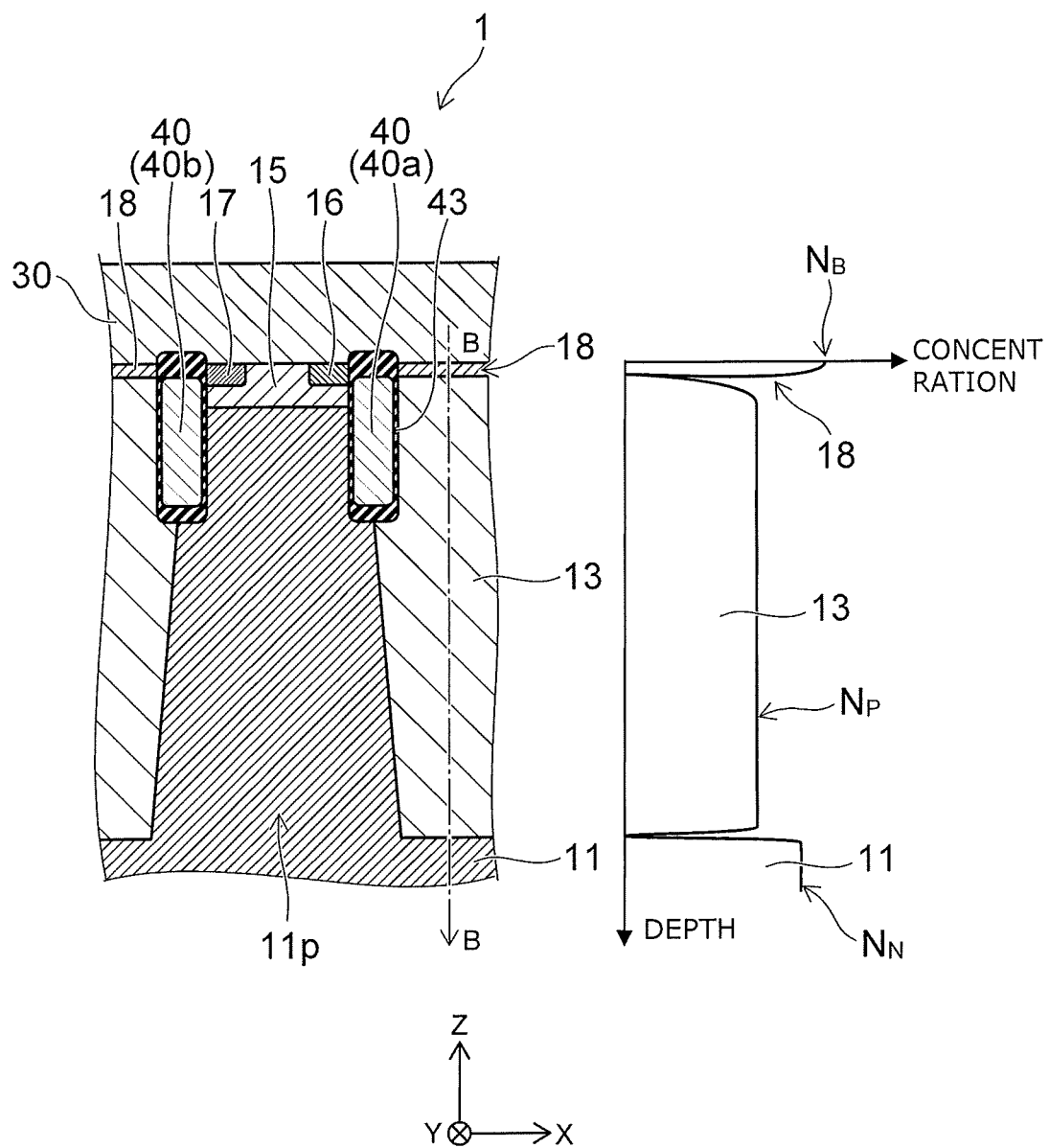
FIG. 3 is a schematic view showing the configuration of the semiconductor device according to the embodiment.

FIG. 3 is a schematic view showing a structure of the semiconductor device 1 according to the embodiment. In FIG. 3, also illustrated are the impurity concentration profiles in the n-type semiconductor layer 11, the p-type semiconductor layer 13 and the n-type block layer 18 along the B-B line shown in the same figure.

The n-type impurity concentration $N_N$ in the n-type semiconductor layer 11 is, for example, in the concentration range of $1 \times 10^{15}$ to $1 \times 10^{17}$ cm$^{-3}$. The p-type impurity concentration $N_P$ in the p-type semiconductor layer 13 is, for example, in the concentration range of $1 \times 10^{15}$ to $1 \times 10^{17}$ cm$^{-3}$. The n-type impurity concentration $N_B$ in the n-type block layer 18 is, for example, in the concentration range from $1 \times 10^{16}$ to $1 \times 10^{18}$ cm$^{-3}$.

The n-type impurity concentration $N_B$ is, for example, set to be higher than the p-type impurity concentration $N_P$ in the p-type semiconductor layer 13. That is, the p-type portion positioned between the p-type semiconductor layer 13 and the source electrode 30 is inverted to the n-type portion, and is set to have the concentration suitable for suppressing the hole injection from the source electrode 30.

On the other hand, the n-type impurity concentration in the n-type source layer 16 is, for example, in the concentration range of $1 \times 10^{18}$ to $1 \times 10^{21}$ cm$^{-3}$. That is, the n-type impurity concentration $N_B$ in the block layer 18 is not more than one tenth of the n-type impurity concentration in the n-type source layer 16.

Figure 4A:
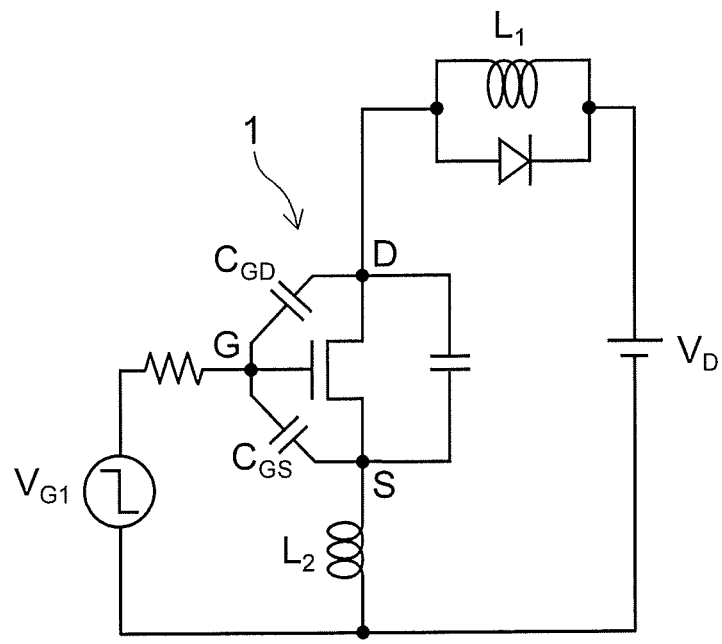
FIGS. 4A and 4B are schematic views showing the operation of the semiconductor device according to the embodiment.
Figure 4B:
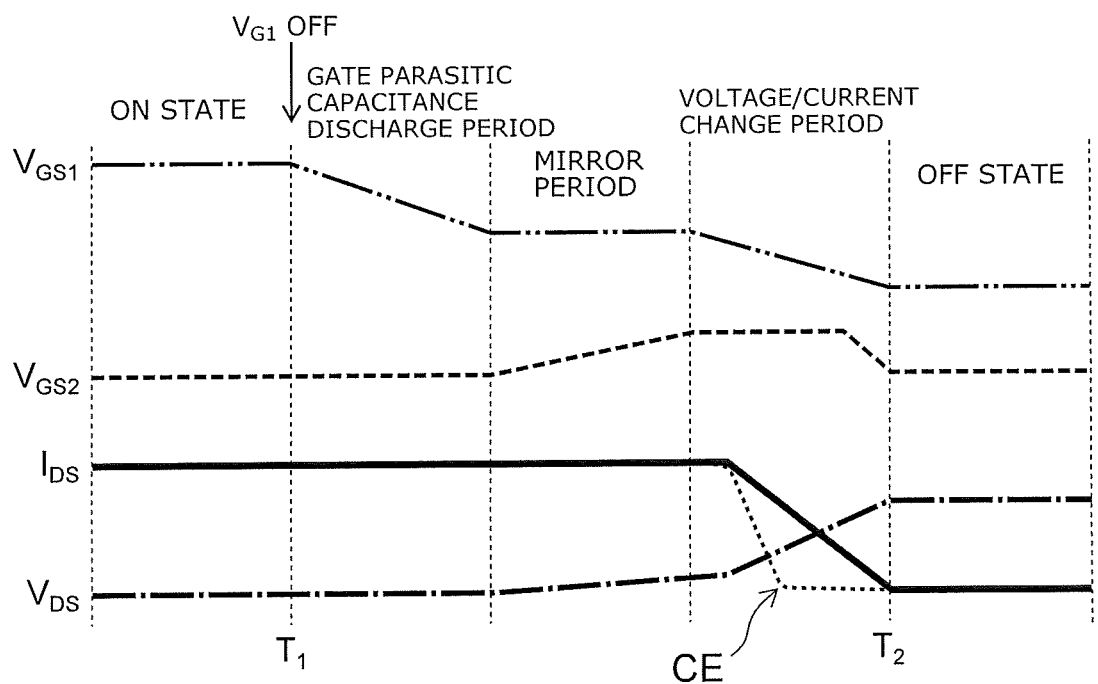

FIGS. 4A and 4B are schematic views showing the operation of the semiconductor device 1 according to the embodiment. FIG. 4A is a schematic view showing a switching circuit including the semiconductor device 1. FIG. 4B is a time chart showing a method for controlling the semiconductor device 1.

In the circuit shown in FIG. 4A, a power supply is connected between the source and drain of the semiconductor device 1 via an inductive load $L_1$, and supply the voltage $V_D$. A gate voltage $V_G$ is supplied between the gate and source of the semiconductor device 1. The gate voltage $V_G$ is supplied to the first gate electrode 40a. In FIG. 4A, a gate voltage supplied to the second gate electrode 40b is omitted.

The time chart illustrated in FIG. 4B shows the changes of a potential $V_{GS1}$ of the first gate electrode 40a, a potential $V_{GS2}$ of the second gate electrode 40b, a drain current $I_{DS}$, and a drain voltage $V_{DS}$ in the process of turning off the semiconductor device 1.

For example, when the semiconductor device 1 is in the ON state, the voltage $V_{G1}$ supplied to the first gate electrode 40a is changed to the OFF voltage at time $T_1$. Thereby, the semiconductor device 1 is turned to the OFF state at time $T_2$. The semiconductor device 1 is turned off during the time period $T_1$ to $T_2$ through the discharge period of the gate parasitic capacitance, the mirror period, and the current/voltage change period.

For example, when the source electrode 30 is grounded at an earth potential, and the semiconductor device 1 is in the ON state, a plus voltage not less than the threshold voltage is applied to the first gate electrode 40a, and the n-type inversion layer is induced between the p-type diffusion layer 15 and the first gate electrode 40a. Thereby, the electric conduction is provided between the n-type source layer 16 and the n-type semiconductor layer 11; and the drain current $I_{DS}$ flows. The drain voltage $V_{DS}$ is a low voltage corresponding to the product of the drain current $I_{DS}$ and the ON resistance.

On the other hand, a minus voltage is applied to the second gate electrode 40b, and the p-type inversion layer is induced between the n-type semiconductor layer 11 and the second gate electrode 40b. Thus, the electric conduction is provided between the p-type semiconductor layer 13 and the p-type diffusion layer 15 via the p-type inversion layer.

When the voltage $V_{G1}$ applied to the first gate electrode 40a is reduced to the OFF voltage at the time $T_1$, discharging the electric currents starts at the gate parasitic capacitances $C_{GD}$ and $C_{GS}$. Then, the discharge period starts, in which the potential $V_{GS1}$ at the first gate electrode 40a gradually decreases. During this period, the potential $V_{GS1}$ at the first gate electrode 40a is higher than the threshold, and the drain current $I_{DS}$ and the drain voltage $V_{DS}$ are maintained under the ON state. The voltage supplied to the second gate electrode 40b is maintained, and the potential $V_{GS2}$ at the second gate electrode 40b is held at the minus potential.

Then, the potential $V_{GS1}$ at the first gate electrode 40a is further decreased, and the n-type inversion layer gradually disappears between the p-type diffusion layer 15 and the first gate electrode 40a. The Mirror period starts when the channel current, which flows through the n-type inversion layer, is not enough to maintain the load current. During the Mirror period, the drain voltage $V_{DS}$ gradually increases, and the displacement current flows through the gate parasitic capacitance $C_{GD}$ between the gate and drain electrodes, and the gate parasitic capacitance $C_{GS}$ between the gate and source electrodes. Thereby, the drain current $I_{DS}$ is maintained to be substantially constant, which is the sum of the channel current and the displacement current, and the potential $V_{GS1}$ at the first gate electrode 40a is also maintained to be substantially constant.

In the semiconductor device 1, the voltage supplied to the second gate electrode 40b is raised, for example, when the Mirror period starts. The potential $V_{GS2}$ at the second gate electrode 40b is increased to the level at which the p-type inversion layer disappears between the n-type semiconductor layer 11 and the second gate electrode 40b.

Then, the current/voltage change period starts, and the potential $V_{GS1}$ at the first gate electrode 40a gradually decreases. When the potential $V_{GS1}$ at the first gate electrode 40a is lower than the threshold, the drain current $I_{DS}$ is decreased, and the n-type semiconductor layer 11 and the p-type semiconductor layer 13 start to be depleted. Then, holes in the p-type semiconductor layer 13 are gradually ejected to the source electrode 30 through the n-type block layer 18, because the p-type inversion layer is disappeared between the n-type semiconductor layer 11 and the second gate electrode 40b, That is, the progress of depletion is suppressed in the p-type semiconductor layer 13.

As shown in FIG. 4B, the drain current $I_{DS}$ decreases to a zero level at the time $T_2$, resulting in the OFF state. The drain voltage $V_{DS}$ increases to the voltage level $V_D$ of the power supply, and the n-type semiconductor layer 11 and the p-type semiconductor layer 13 are depleted. In the OFF state, the potential $V_{GS2}$ at the second gate electrode 40b, for example, is returned to the minus potential.

The drain current $I_{DS}$ shown by a dotted line in FIG. 4B exhibits a characteristic of a semiconductor device according to a comparative example (not shown), for example, in which the second gate electrode 40b is not provided and the p-type semiconductor layer 13 is directly connected to the p-type diffusion layer 15. The semiconductor device without the n-type block layer 18 also shows the similar characteristics. In these semiconductor devices, holes are ejected smoothly from the p-type semiconductor layer 13 to the source electrode 30, and the p-type semiconductor layer 13 is rapidly depleted as the drain current $I_{DS}$ is decreased. As such, the drain current $I_{DS}$ is also decreased rapidly, resulting in the large change rate $dV_{DS}/dT$ of the drain voltage $V_{DS}$. Thus, the electromagnetic interference noise, for example, via the parasitic inductance $L_2$ becomes larger.

In contrast, it is possible in the semiconductor device 1 to control the electric conduction between the p-type semiconductor layer 13 and the p-type diffusion layer 15 by the second gate electrode 40b. The hole ejection from the p-type semiconductor layer 13 to the source electrode 30 can be suppressed by providing the n-type block layer 18. Therefore, it is possible in the turn off process of the semiconductor device 1 to suppress the hole ejection from the p-type semiconductor layer 13 to the source electrode 30 and make the change rate $dV_{DS}/dT$ of the drain voltage $V_{DS}$ small. As a result, the electromagnetic interference noise can be suppressed.

Figure 5A:
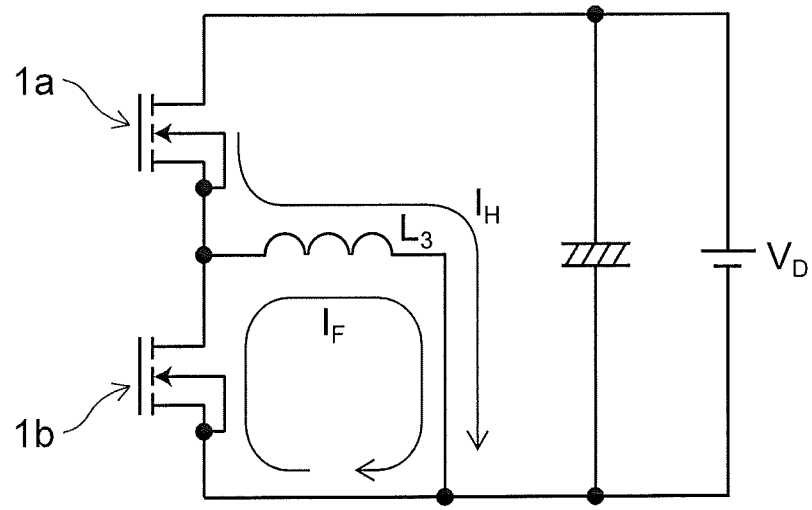
FIGS. 5A and 5B are schematic views showing other operation of the semiconductor device according to the embodiment.
Figure 5B:
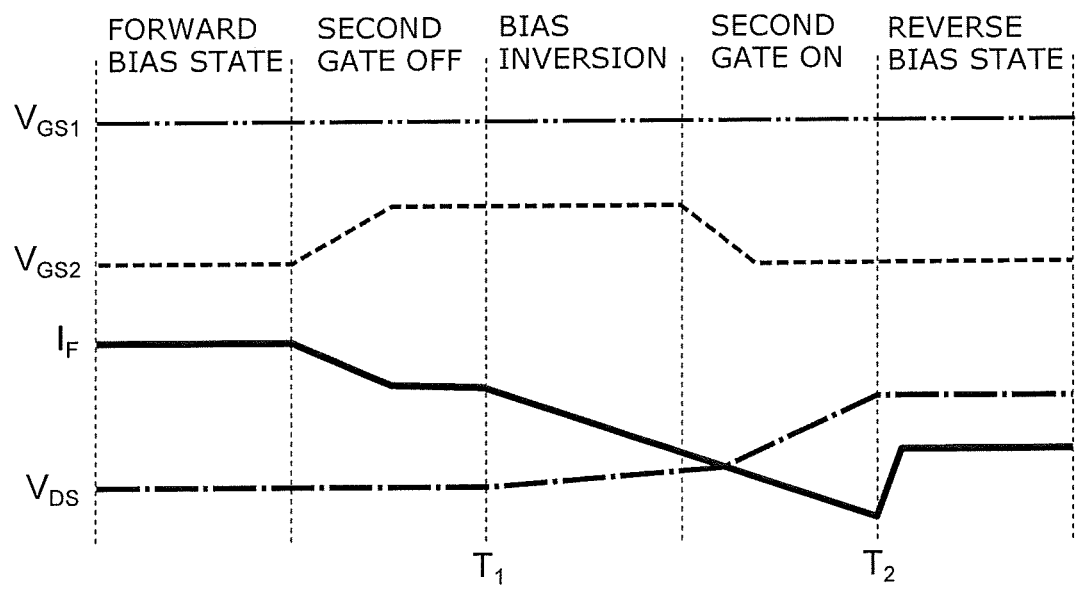

FIGS. 5A and 5B are schematic views showing an operation of the semiconductor device 1 according to the embodiment. FIG. 5A is a schematic view showing a bridge circuit including the semiconductor device 1. FIG. 5B is a time chart showing the method for controlling the semiconductor device 1.

In the circuit shown in FIG. 5A, two semiconductor devices 1a and 1b are connected in series, and an inductive load $L_3$ is connected at the midpoint thereof. Such a circuit is used for an inverter, for example, and operates by alternately turning the semiconductor devices 1a or 1b on.

In such a circuit, for example, during the process of turning the semiconductor device 1a off, which are on a high potential side, the semiconductor device 1b on a low potential side serves as a freewheeling diode, and the recovery current $I_F$ flows between the source and drain electrodes thereof. That is, a minus voltage is induced in the inductive load $L_3$ by the variation of the drain current $I_H$ in the semiconductor device 1a; and the pn junction in the semiconductor device 1b is forward-biased, which is provided between the n-type semiconductor layer 11 and the p-type diffusion layer 15 and between the n-type semiconductor layer 11 and the p-type semiconductor layer 13.

As the semiconductor device 1b serves as the reflux diode, the electric energy held in the inductive load $L_3$ can be released. In the semiconductor device 1b having the SJ structure, however, there may be a case where the turn off delay causes a switching loss when serving as a freewheeling diode, because the pn-junction has the broad area between the n-type semiconductor layer 11 and the p-type diffusion layer 15 and between the n-type semiconductor layer 11 and the p-type semiconductor layer 13. In contrast, it is possible in the semiconductor device 1 to reduce the switching loss by applying the gate control described below to shorten the turn off period.

The time chart shown in FIG. 5B shows the changes of the potential $V_{GS1}$ at the first gate electrode 40a, the potential $V_{GS2}$ at the second gate electrode 40b, the recovery current $I_F$, and the drain voltage $N_{DS}$ in the turn-off process of the semiconductor device 1b which serves as the freewheeling diode. For example, the source side of the semiconductor device 1b is at the earth potential.

As shown in FIG. 5B, the potential $V_{GS1}$ at the first gate electrode 40a is constant, for example, at the zero level.

The potential $V_{GS2}$ at the second gate electrode 40b is held at the minus potential in the forward-biased state. Thereby, the p-type inversion layer is induced between the n-type semiconductor layer 11 and the second gate electrode 15, and provides the electric conduction between the p-type semiconductor layer 13 and the p-type diffusion layer 15. The drain voltage $V_{DS}$ is a minus voltage, and thus, the recovery current $I_F$ flows between the source and drain electrodes.

Then, at the time $T_1$, the potential $V_{GS2}$ at the second gate electrode 40b is increased before the drain voltage $N_{DS}$ is inverted to a plus voltage. Thereby, the p-type inversion layer disappears, which is induced between the n-type semiconductor layer 11 and the second gate electrode 40b, and the electric conduction is interrupted between the p-type semiconductor layer 13 and the p-type diffusion layer 15. Thus, the hole supply from the source electrode 30 to the p-type semiconductor layer 13 through the p-type diffusion layer 15 is interrupted, and the hole injection from the p-type semiconductor layer 13 to the n-type semiconductor layer 11 is suppressed. That is, the electron and hole density in the n-type semiconductor layer 11 are decreased. The recovery current $I_F$ is also decreased corresponding thereto.

Subsequently, when the drain voltage $N_{DS}$ is inverted, the electrons and holes in the n-type semiconductor layer 11 are ejected to the drain electrode 20 and the source electrode 30, respectively, and thus, the recovery current $I_F$ is maintained to flow. The n-type semiconductor layer 11 and the p-type semiconductor layer 13 are depleted as the drain voltage $V_{DS}$ increases. For example, at the time $T_2$, the semiconductor device 1b is in the reverse-biased state (i.e., the OFF state), and the recovery current $I_F$ is decreased to the zero level.

In this manner, when the potential $V_{GS2}$ at the second gate electrode 40b is appropriately controlled in the semiconductor device 1, the electron and hole density in the n-type semiconductor layer 11 can be decreased to shorten the turn off period ($T_1$ to $T_2$).

Furthermore, the p-type inversion layer may be induced between the n-type semiconductor layer 11 and the second gate electrode 40b by applying the minus voltage to the second gate electrode 40b during the time period $T_1$ to $T_2$. Thereby, the electric conduction is provided between the p-type semiconductor layer 13 and the p-type diffusion layer 15, enhancing the hole ejection via the p-type semiconductor layer 13 and the p-type diffusion layer 15. As a result, the turn off period ($T_1$ to $T_2$) can be further shortened.

When the semiconductor device 1 serves, for example, as the reflux diode, it is possible to suppress the hole injection to the n-type semiconductor layer 11 by appropriately controlling the potential $V_{GS2}$ at the second gate electrode 40b, and further, to enhance the hole ejection from the n-type semiconductor layer 11. Thereby, the turn off period ($T_1$ to $T_2$) can be shortened, and the switching loss can be reduced in the bridge circuit shown in FIG. 5A.

The methods for controlling the semiconductor device 1 shown in FIG. 4B and FIG. 5B are illustrated as the examples, and not limited thereto. For example, the timing for applying the voltage to the first gate electrode 40*a* and the second gate electrode 40*b* can be appropriately changed.

Figure 6:
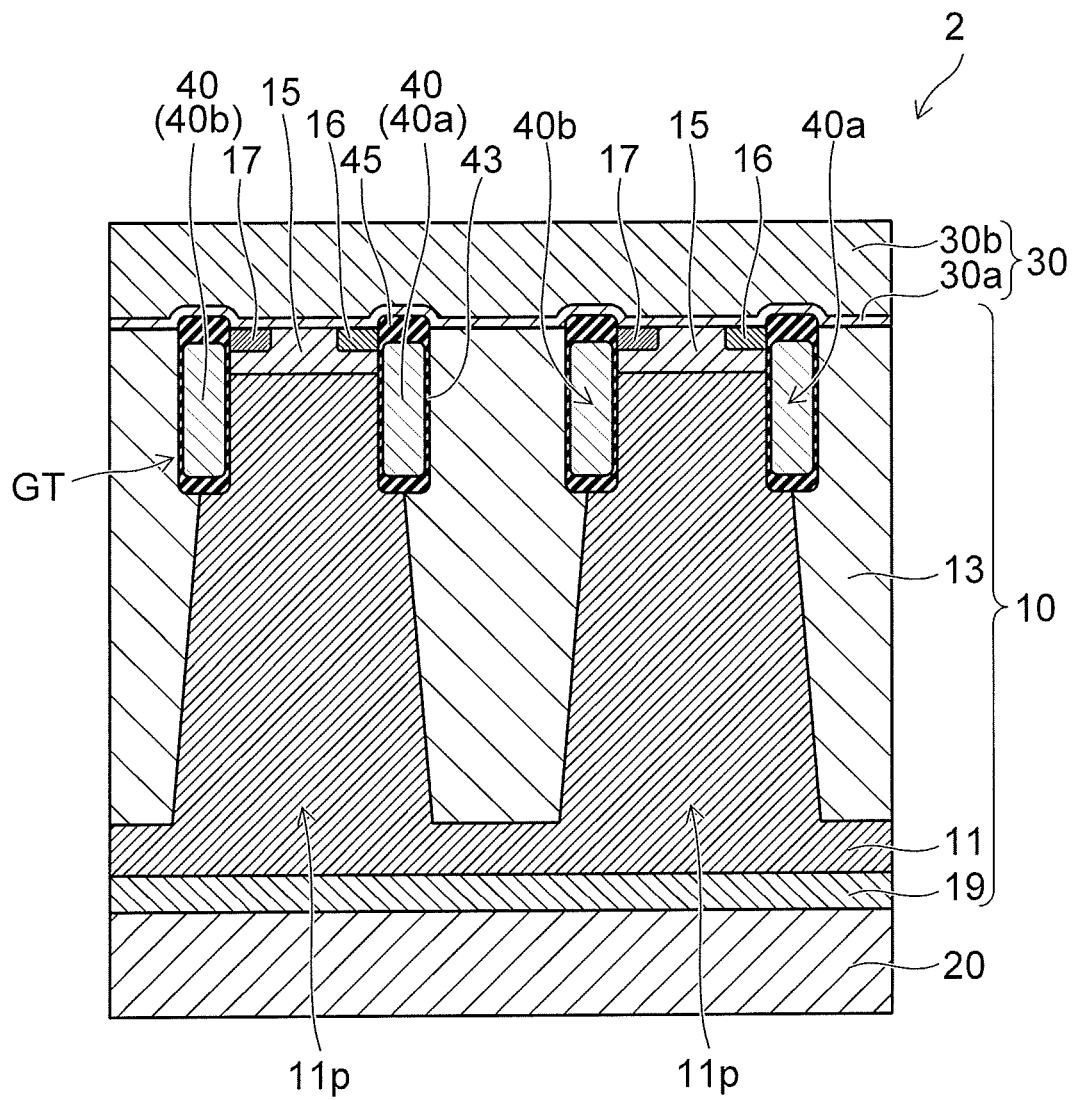
FIG. 6 is a schematic cross sectional view showing a semiconductor device according to a variation of the embodiment.

FIG. 6 is a schematic cross sectional view showing a semiconductor device 2 according to a variation of the embodiment. In the semiconductor device 2, the n-type block layer 18 is not provided, and the source electrode 30 contacts directly, for example, to the p-type semiconductor layer 13. Other configuration is the same as the semiconductor device 1.

In the semiconductor device 2, for example, a Schottky junction is formed between the p-type semiconductor layer 13 and the source electrode 30. That is, the potential barrier to holes is provided between the p-type semiconductor layer 13 and the source electrode 30. Thereby, the hole injection from the source electrode 30 to the p-type semiconductor layer 13 is suppressed.

The source electrode 30 has, for example, the stacked structure including a first layer 30*a*, and a second layer 30*b*. The first layer 30*a* includes a material such as titanium (Ti) that easily provides the Schottky junction. The second layer 30*b* includes, for example, gold (Au) or aluminum (Al). The first layer 30*a* is, for example, formed to contact the p-type semiconductor layer 13. A barrier layer may be placed between the first layer 30*a* and the second layer 30*b*. For example, the migration of aluminum can be suppressed by placing the barrier layer including platinum (Pt) and like between the titanium layer and the aluminum layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor part including a first semiconductor layer of a first conductivity type and a second semiconductor layer of a second conductivity type;
    a first electrode provided on a back surface of the semiconductor part;
    a second electrode provided on a front surface of the semiconductor part; and
    a plurality of control electrodes provided between the semiconductor part and the second electrode, the plurality of control electrodes including a first control electrode and a second control electrode adjacent to the first control electrode, the control electrodes each being placed inside a trench provided on the front surface side of the semiconductor part, the first control electrode being electrically insulated from the semiconductor part via a first insulating film, the second control electrode being electrically insulated from the semiconductor part via a second insulating film,
    the second semiconductor layer being provided in a plurality, the plurality of second semiconductor layers extending in the first semiconductor layer along a direction from the second electrode toward the first electrode, the first semiconductor layer including first and second portions alternately arranged along the front surface of the semiconductor part, the second semiconductor layers each being positioned between the first and second portions,
    the first control electrode being placed at a boundary of the first portion of the first semiconductor layer and the second semiconductor layer, the second control electrode being placed at a boundary of the second portion of the first semiconductor layer and the second semiconductor layer,
    the semiconductor part further including a third semiconductor layer of a second conductivity type, a fourth semiconductor layer of a first conductivity type and a fifth semiconductor layer of a second conductivity type, the third semiconductor layer being provided between the second electrode and the first and second portions of the first semiconductor layer, the third semiconductor layer being positioned between the first and second control electrode, the fourth semiconductor layer being selectively provided between the third semiconductor layer and the second electrode, the fifth semiconductor layer being selectively provided between the third semiconductor layer and the second electrode,
    the first control electrode being opposed to the first semiconductor layer, the third semiconductor layer, and the fourth semiconductor layer via the first insulating film,
    the second control electrode being opposed to the first semiconductor layer, the third semiconductor layer, and the fifth semiconductor layer via the second insulating film,
    the plurality of control electrodes being electrically insulated from the second electrode via a third insulating film,
    the second electrode being electrically connected to the fourth semiconductor layer and the fifth semiconductor layer.

2. The device according to claim 1, wherein
    the semiconductor part further includes a sixth semiconductor layer provided between the second semiconductor layer and the second electrode, and
    the second electrode is electrically connected to the sixth semiconductor layer.

3. The device according to claim 2, wherein
    the sixth semiconductor layer includes first conductivity type impurities with a higher concentration than a concentration of first conductivity type impurities in the first semiconductor layer; and
    the concentration of the first conductivity type impurities in the sixth semiconductor layer is lower than a concentration of first conductivity type impurities in the fourth semiconductor layer.

4. The device according to claim 1, wherein the second electrode contacts the second semiconductor layer.

5. The device according to claim 4, wherein the second electrode is provided on the second semiconductor layer so that a potential barrier to the second conductivity type carriers in the second semiconductor layer is provided between the second electrode and the second semiconductor layer.

6. The device according to claim 4, wherein the second electrode includes a first layer and a second layer, the first layer contacting the second semiconductor layer, the second layer being provided on the first layer.

7. The device according to claim 6, wherein the first layer includes titanium; and the second layer includes aluminum or gold.

8. The device according to claim 1, wherein
    The fourth semiconductor layer extends along the first control electrode; and the fifth semiconductor layer extends along the second control electrode.

9. The device according to claim 1, wherein the first semiconductor layer includes first conductivity type impurities; and the second semiconductor layer includes second conductivity type impurities, a total amount of the second conductivity type impurities in the second semiconductor layer being equal to a total amount of the first conductivity type impurities included in the first or second portion of the first semiconductor layer.

10. A method for controlling the semiconductor device according to claim 1, the method comprising:

applying a second voltage to the second control electrode to induce second-conductivity-type carriers at an interface of the first semiconductor layer and the second insulating film while applying a first voltage to the first control electrode to induce first-conductivity-type carriers at an interface of the third semiconductor layer and the first insulating film, and changing the second voltage at the second control electrode so that the second conductivity type carriers disappear at the interface of the first semiconductor layer and the second insulating film during a process of changing the first voltage at the first control electrode so that the first conductivity type carriers disappear at the interface of the third semiconductor layer and the first insulating film.

11. A method for controlling the semiconductor device according to claim 1, the method comprising:

applying a second voltage to the second control electrode to induce second conductivity type carriers at an interface of the first semiconductor layer and the second insulating film while a first voltage is applied between the first electrode and the second electrode so that a pn junction between the first semiconductor layer and the third semiconductor layer is forward-biased, and changing the first voltage between the first electrode and the second electrode so that the pn junction between the first semiconductor layer and the third semiconductor layer is reverse-biased after the second voltage is changed at the second control electrode so that the second conductivity type carriers disappear at the interface of the first semiconductor layer and the second insulating film.

* * * * *